United States Patent
Lee

(10) Patent No.: US 8,081,016 B2
(45) Date of Patent: Dec. 20, 2011

(54) INPUT BUFFER

(75) Inventor: Eun Ryeong Lee, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 3 days.

(21) Appl. No.: 12/844,077

(22) Filed: Jul. 27, 2010

(65) Prior Publication Data

US 2011/0050289 A1    Mar. 3, 2011

(30) Foreign Application Priority Data

Aug. 28, 2009  (KR) .................. 10-2009-0080739

(51) Int. Cl.
*H03K 3/00* (2006.01)
(52) U.S. Cl. ........................ 327/108; 327/52; 327/63
(58) Field of Classification Search .................. None
See application file for complete search history.

(56) References Cited

U.S. PATENT DOCUMENTS

| 5,343,479 | A | 8/1994 | Kiyozuka |
| 6,414,523 | B1 * | 7/2002 | Yoshizaki ..................... 327/112 |
| 6,943,585 | B2 * | 9/2005 | Lee et al. ........................ 326/58 |
| 7,279,934 | B2 * | 10/2007 | Do ................................ 326/83 |

FOREIGN PATENT DOCUMENTS

| KR | 10-2002-0037852 A | 5/2002 |
| KR | 1020090011558 A | 2/2009 |

* cited by examiner

*Primary Examiner* — An T Luu
(74) *Attorney, Agent, or Firm* — William Park & Associates Ltd.

(57) ABSTRACT

An input buffer includes a driving signal generation unit, a comparison signal generation unit, and a driving unit. The driving signal generation unit is configured to generate first and second driving signals which are selectively enabled in response to a control signal generated depending on a level of an input signal. The comparison signal generation unit is configured to compare the level of the input signal with the level of a reference voltage and generate a comparison signal. The driving unit is configured to buffer the comparison signal and drive an output signal with a drivability determined by the first and second driving signals.

11 Claims, 3 Drawing Sheets

INPUT BUFFER

CROSS-REFERENCES TO RELATED APPLICATIONS

The present application claims priority under 35 U.S.C 119(a) to Korean application number 10-2009-0080739, filed on Aug. 28, 2009, in the Korean Intellectual Property Office, which is incorporated herein by reference in its entirety set forth in full.

BACKGROUND

An input buffer is a part of a semiconductor memory device which compares the level of the external input signal with the level of a predetermined reference voltage and determines whether the external input signal is of a high level signal or a low level signal. The determination result is then outputted by the input buffer to an internal circuit of the semiconductor device. That is, the internal circuit included in the semiconductor device receives the external input signal through the input buffer that has compared the level of the external input signal with the level of the predetermined reference voltage. There are several types of input buffers, but a type of input buffer that is implemented in a differential amplifier configuration having a current mirror is typically found in a synchronous semiconductor device.

FIG. 1 is a waveform diagram of an input signal VIN and an output signal VOUT in a conventional input buffer.

As illustrated in FIG. 1, when a reference level of an input signal VIN (that is, the mean value between a high level and a low level of VIN) inputted to an input buffer is lower than a preset reference level, that is, for example, the reference level of the input signal VIN VDD/2−ΔV is less than the preset reference level VDD/2 as shown in FIG. 1, the high level durations X of an output signal VOUT outputted by the input buffer become shorter than the low level durations Y thereof. As such, whenever the high level durations X of the output signal VOUT outputted by the input buffer end up being short due to lowering of the reference level of the input signal VIN, this could cause malfunction in the internal circuit of the semiconductor memory device that operates with the output signal VOUT.

SUMMARY

An embodiment of the present invention relates to an input buffer which is capable of substantially preventing malfunction of an internal circuit, which receives an output signal, by increasing drivability for an output signal when an input signal having a low reference level is inputted.

In one embodiment, an input buffer includes: a driving signal generation unit configured to generate first and second driving signals which are selectively enabled in response to a control signal generated depending on a level of an input signal; a comparison signal generation unit configured to compare the level of the input signal with the level of a reference voltage and generate a comparison signal; and a driving unit configured to buffer the comparison signal and drive an output signal with a drivability determined by the first and second driving signals.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
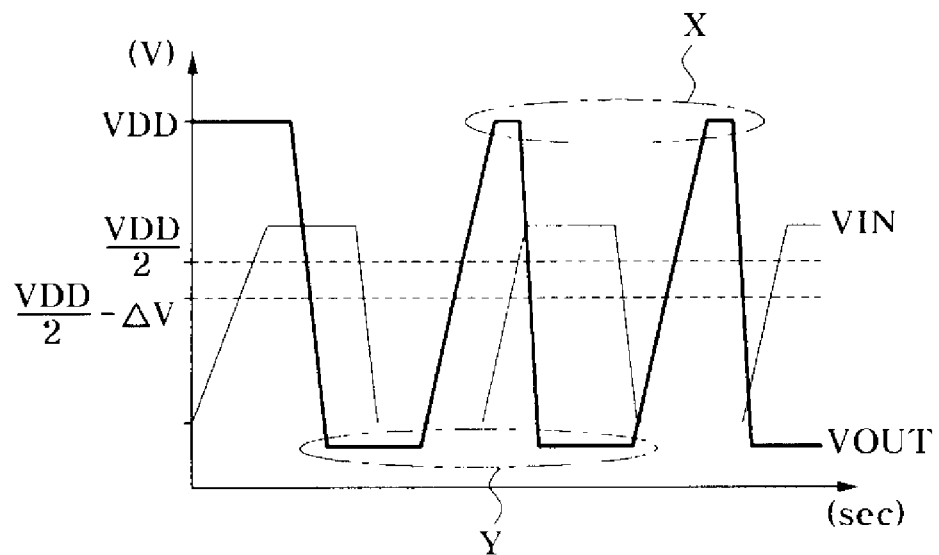
FIG. 1 is a waveform diagram of an input signal and an output signal in a conventional input buffer.
Figure 2:
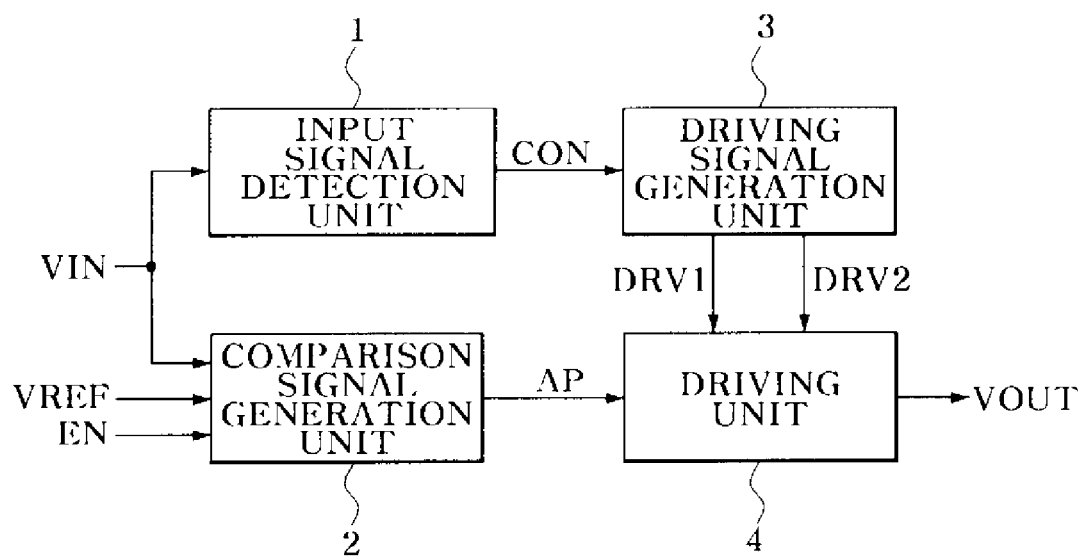
FIG. 2 is a block diagram illustrating the configuration of an input buffer according to an embodiment of the present invention.

FIG. 2 is a block diagram illustrating the configuration of an input buffer according to an embodiment of the present invention. As illustrated in FIG. 2, the input buffer includes an input signal detection unit 1, a comparison signal generation unit 2, a driving signal generation unit 3, and a driving unit 4.

The configuration of the input buffer according to an embodiment of the present invention will be described in more detail with reference to FIGS. 2-3.

The input signal detection unit 1 as shown in FIG. 2 is configured to detect a reference level of an input signal VIN (a mean value between a high level and a low level of VIN) and to generate a control signal CON which is enabled to a high level when the reference level of the input signal VIN is lower than the level of a preset reference voltage (also referred to as a preset reference level). For example, in case where the preset reference level VREF is set to half the level of a power supply voltage (VDD), that is, VREF=VDD/2, the input signal detection unit 1 generates the control signal CON of a high level when the reference level of the input signal VIN (that is, the mean value between a high level and a low level of VIN) is lower than half the level of the power supply voltage (VDD). The input signal detection unit 1 may be implemented with a typical reference level detection circuit.

Figure 3:
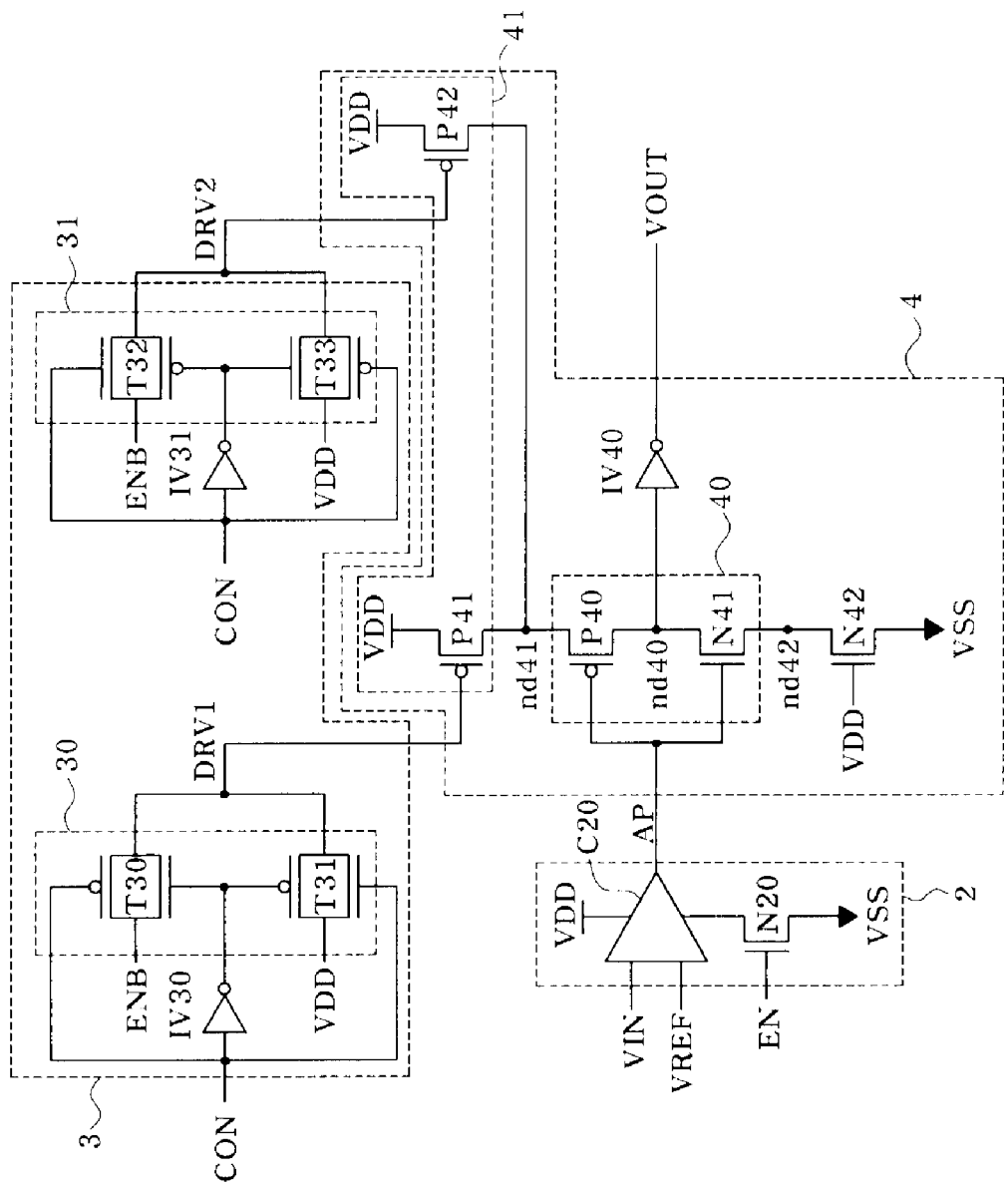
FIG. 3 is a detailed circuit diagram of the input buffer illustrated in FIG. 2.

Referring to FIG. 3, the comparison signal generation unit 2 includes a comparator C20 and an NMOS transistor N20. The comparator C20 is configured to compare the signal level of the input signal VIN with the level of a preset reference voltage VREF (for example, half the level of the power supply voltage or VDD/2) and generate a comparison signal AP. The NMOS transistor N20 is configured to turn on in response to an input buffer enable signal EN to enable the driving of the comparator C20. The comparator C20 may be implemented with a differential amplifier circuit which differentially amplifies the input signal VIN and the preset reference voltage VREF, and the enable signal EN is a signal which is enabled to a high level in order to drive the input buffer. In this embodiment, the comparison signal AP outputted from the comparator C20 has a high level whenever the signal level of the input signal VIN is higher than the level of the preset reference voltage VREF (for example, half the level of the power supply voltage VDD), and has a low level whenever the signal level of the input signal VIN is lower than the level of the preset reference voltage VREF.

The driving signal generation unit 3 includes a first selective transfer section 30 and a second selective transfer section 31. Specifically, the first selective transfer section 30 includes transfer gates T30 and T31 configured to selectively transfer an inverted enable signal ENB or a power supply voltage VDD as a first driving signal DRV1 in response to the control signal CON. The second selective transfer section 31 includes transfer gates T32 and T33 configured to selectively transfer the inverted enable signal ENB or the power supply voltage VDD as a second driving signal DRV2 in response to the control signal CON. When the reference level of the input signal VIN is lower than a preset reference level VREF (that is, CON is set to a high level), the first selective transfer section 30 generates the first driving signal DRV1 having a level substantially equal to the level of the power supply voltage VDD. When the reference level of the input signal VIN is higher than the preset reference level VREF, the first selective transfer section 30 generates the first driving signal DRV1 having a level substantially equal to the level of the inverted enable signal ENB. Also, when the reference level of the input signal VIN is lower than the preset reference level VREF (that is, CON is enabled to a high level), the second selective transfer section 31 generates the second driving signal DRV2 having a level substantially equal to the level of the inverted enable signal ENB. When the reference level of the input signal VIN is higher than the preset reference level VREF, the second selective transfer section generates the second driving signal DRV2 having a level substantially equal to the level of the power supply voltage VDD.

The driving unit 4 includes a buffer section 40, a pull-up section 41, an NMOS transistor N42, and an inverter IV40. Specifically, the buffer section 40 includes a PMOS transistor P40 and an NMOS transistor N41. The PMOS transistor P40 is coupled between a node nd40 and a node nd41 and configured to operate as a pull-up element which pulls up the node nd40 in response to the comparison signal AP. The NMOS transistor N41 is coupled between the node nd40 and a node nd42, and configured to operate as a pull-down element which pulls down the node 40 in response to the comparison signal AP. The pull-up section 41 includes a PMOS transistor P41 and a PMOS transistor P42. The PMOS transistor P41 is coupled between a power supply voltage (VDD) terminal and the node nd41, and configured to operate as a pull-up element which pulls up the node nd41 in response to the first driving signal DRV1. The PMOS transistor P42 is coupled between the power supply voltage (VDD) terminal and the node nd41 and configured to operate as a pull-up element which pulls up the node nd41 in response to the second driving signal DRV2. The NMOS transistor N42 is coupled between the node nd42 and a ground voltage (VSS) terminal and configured to operate as a resistor when it is turned on in response to the power supply voltage VDD. The inverter IV40 is configured to operate as a buffer which buffers a signal of the node nd40 and generates the buffered signal as an output signal VOUT. The PMOS transistor P42 is formed to be larger in size than the PMOS transistor P41. Thus, when the input signal VIN having a signal level lower than the preset reference level VREF is inputted, the PMOS transistor P42 is turned on to increase pull-up drivability of the buffer 40.

The operation of the core voltage (VCORE) generation circuit configured as above will be described below. More specifically, a case where the reference level of the input signal VIN is higher than the preset reference level VREF (i.e., CON is set to a low level) and a case where the reference level of the input signal VIN is lower than the preset reference level VREF (i.e., CON is set to a high level) will be described.

First, the case where the reference level of the input signal VIN is higher than the preset reference level VREF (i.e., CON is set to a low level) will now be described.

When the input buffer enable signal EN changes to a high level and thus the input buffer starts to operate, the driving of the comparator C20 is enabled by the enable signal EN of the high level, and the comparator C20 compares the signal level of the input signal VIN with the level of the preset reference voltage VREF and generates the comparison signal AP.

At this time, since the reference level of the input signal VIN is higher than the preset reference level, the input signal detection unit 1 generates the control signal CON of a low level. The first selective transfer section 30 generates the first driving signal DRV1 having a level substantially equal to the level of the inverted enable signal ENB in response to the control signal CON of the low level, and the second selective transfer section 31 generates the second driving signal DRV2 having a level substantially equal to the level of the power supply voltage VDD in response to the control signal CON of the low level.

Therefore, the PMOS transistor P41 of the pull-up section 41 is turned on in response to the first driving signal DRV1 which is generated to have the level substantially equal to the level of the inverted enable signal ENB, and the PMOS transistor P42 is turned off in response to the second driving signal DRV2 which is generated to have the level substantially equal to the level of the power supply voltage VDD. Hence, the buffer 40 is driven by the pull-up drivability of the PMOS transistor P41.

Next, the case where the reference voltage of the input signal VIN (VDD/2−ΔV) is lower than the preset reference level (VDD/2) will be described. In this case, the control signal CON would be set to a high level.

Figure 4:
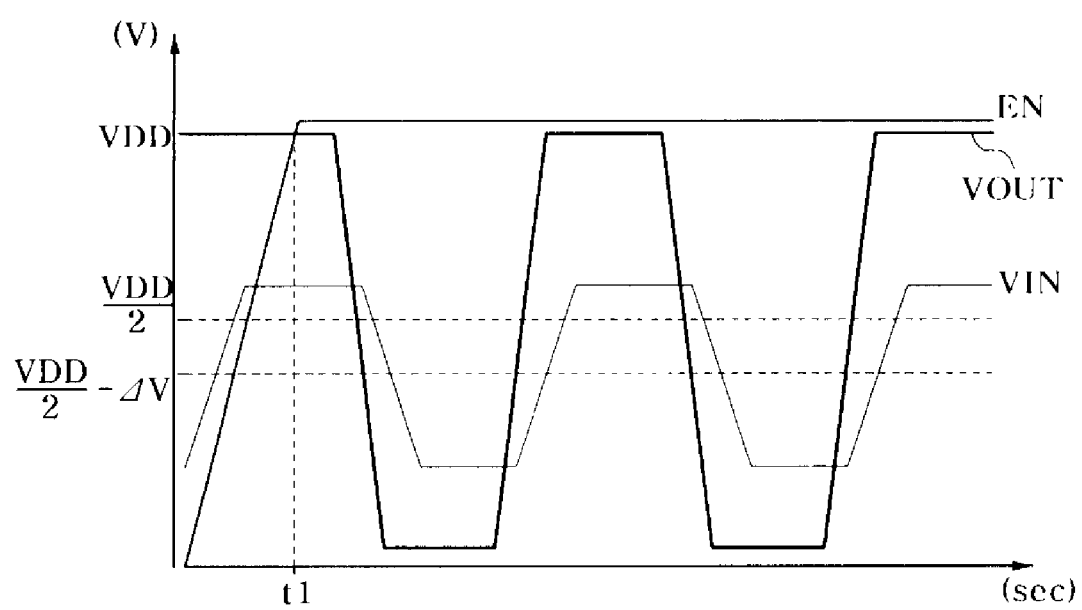
FIG. 4 is a waveform diagram of an input signal and an output signal in the input buffer illustrated in FIGS. 2 and 3.

When the input buffer enable signal EN changes to a high level at time t1 (see FIG. 4) and thus when the input buffer starts to operate, the driving of the comparator C20 is enabled in response to the enable signal EN of the high level, and the comparator C20 compares the signal level of the input signal VIN with the level of the preset reference voltage VREF and generates the comparison signal AP.

As already mentioned above, since the reference level of the input signal VIN (VDD/2−ΔV) is lower than the preset reference level (VDD/2), the input signal detection unit 1 generates the control signal CON of a high level. The first selective transfer section 30 generates the first driving signal DRV1 having a level substantially equal to the level of the power supply voltage VDD in response to the control signal CON of the high level, and the second selective transfer section 31 generates the second driving signal DRV2 having a level substantially equal to the level of the inverted enable signal ENB in response to the control signal CON of the high level.

Therefore, the PMOS transistor P42 of the pull-up section 41 is turned on in response to the second driving signal DRV2 which is generated to have the level substantially equal to the level of the inverted enable signal ENB, and the PMOS transistor P41 is turned off in response to the first driving signal DRV1 which is generated to have the level substantially equal to the level of the power supply voltage VDD. Hence, the buffer 40 is driven by the pull-up drivability of the PMOS transistor P42. Since the PMOS transistor P42 is formed to be larger in size than the PMOS transistor P41, the pull-up drivability of the buffer 40 increases when the reference level of the input signal VIN is lower than the preset reference level. Due to the increase in the pull-up drivability of the buffer 40, the high level duration of the output signal VOUT is constantly maintained in spite of the low reference level of the input signal VIN.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An input buffer comprising:
   a driving signal generation unit configured to generate first and second driving signals which are selectively enabled in response to a control signal generated depending on a level of an input signal;
   a comparison signal generation unit configured to compare the level of the input signal with the level of a preset reference voltage and generate a comparison signal; and
   a driving unit configured to buffer the comparison signal and drive an output signal with a drivability determined by the first and second driving signals.

2. The input buffer of claim 1, wherein the control signal is enabled when the input signal having a reference level lower than a preset reference level is inputted, wherein the reference level of input signal is the mean value of the high and low levels of the input signal.

3. The input buffer of claim 1, wherein the driving signal generation unit comprises:
   a first selective transfer section configured to selectively transfer a power supply voltage or an inverted enable signal as the first driving signal in response to the control signal; and
   a second selective transfer section configured to selectively transfer the power supply voltage or the inverted enable signal as the second driving signal in response to the control signal.

4. The input buffer of claim 3, wherein the first selective transfer section comprises:
   a first transfer element configured to transfer the power supply voltage as the first driving signal in response to the control signal; and
   a second transfer element configured to transfer the inverted enable signal as the first driving signal in response to the control signal.

5. The input buffer of claim 3, wherein the second selective transfer section comprises:
   a first transfer element configured to transfer the power supply voltage as the second driving signal in response to the control signal; and
   a second transfer element configured to transfer the inverted enable signal as the second driving signal in response to the control signal.

6. The input buffer of claim 1, wherein the comparison signal generation unit comprises:
   a comparator configured to compare the level of the input signal with the level of the preset reference voltage; and
   an enable element configured to enable the driving of the comparator in response to an enable signal.

7. The input buffer of claim 1, wherein the driving unit comprises:
   a first buffer section coupled to a first node and configured to buffer the comparison signal; and
   a pull-up section configured to pull up the first node in response to the first and second driving signals.

8. The input buffer of claim 7, wherein the pull-up section comprises:
   a first pull-up element coupled between a power supply voltage terminal and the first node, and configured to pull up the first node in response to the first driving signal; and
   a second pull-up element coupled between the power supply voltage terminal and the first node, and configured to pull up the first node in response to the second driving signal.

9. The input buffer of claim 8, wherein the second pull-up element comprises a MOS transistor which is larger in size than that of the first pull-up element.

10. The input buffer of claim 7, wherein the first buffer section comprises:
    a pull-up element coupled between the first node and a second node, and configured to pull up the second node in response to the comparison signal; and
    a pull-down element coupled between the second node and a third node, and configured to pull down the second node in response to the comparison signal.

11. The input buffer of claim 10, wherein the driving unit further comprises:
    a MOS transistor coupled between the third node and a ground voltage terminal, and configured to be turned on in response to a power supply voltage; and
    a second buffer section configured to buffer a signal of the second node and generate the output signal.

* * * * *